United States Patent
Wu

(10) Patent No.: US 6,375,364 B1
(45) Date of Patent: Apr. 23, 2002

(54) BACK FACET FLARED RIDGE FOR PUMP LASER

(75) Inventor: Yongan Wu, Chelmsford, MA (US)

(73) Assignee: Corning Lasertron, Inc., Bedford, MA (US)

(*) Notice: Subject to any disclaimer, the term of this patent is extended or adjusted under 35 U.S.C. 154(b) by 0 days.

(21) Appl. No.: 09/477,697

(22) Filed: Jan. 6, 2000

(51) Int. Cl.[7] .............................. G02B 6/36; H01S 3/18; H01S 3/00
(52) U.S. Cl. .............................. 385/88; 385/14; 385/31; 385/37; 385/43; 385/92; 385/11; 372/43; 372/50; 372/6; 359/341
(58) Field of Search .............................. 385/14, 15, 31, 385/37, 42, 43, 88, 89, 92, 93, 94, 11; 372/43, 44, 45, 50, 6; 359/333, 341, 345

(56) References Cited

U.S. PATENT DOCUMENTS

| | | | |
|---|---|---|---|
| 4,689,797 A | | 8/1987 | Olshansky .................... 372/45 |
| 4,728,628 A | | 3/1988 | Fiddyment et al. ......... 437/225 |
| 4,783,788 A | | 11/1988 | Gordon ........................ 372/45 |
| 4,813,050 A | | 3/1989 | Shima et al. .................. 372/45 |
| 4,965,525 A | | 10/1990 | Zah ............................ 330/4.3 |
| 5,078,516 A | * | 1/1992 | Kapon et al. ............... 385/129 |
| 5,652,812 A | * | 7/1997 | Gurib et al. .................... 385/14 |
| 5,703,895 A | * | 12/1997 | Ghirardi et al. ............... 372/50 |
| 6,014,396 A | | 1/2000 | Osinski ........................ 372/46 |
| 6,037,189 A | | 3/2000 | Goto ............................ 438/31 |
| 6,075,801 A | | 6/2000 | Tamanuki et al. ............ 372/46 |

FOREIGN PATENT DOCUMENTS

| | | | |
|---|---|---|---|
| EP | 0793126 A | 9/1997 | ............... 385/37 X |
| EP | 0812040 A | 12/1997 | ............... 385/92 X |
| JP | 01220491 | 9/1989 | ............... 385/14 X |
| JP | 06188510 | 7/1994 | ............... 385/14 X |
| JP | 08195525 | 7/1996 | ............... 385/14 X |
| JP | 10229246 | 8/1998 | ............... 385/14 X |
| WO | WO 98/55891 | 12/1998 | ............... 385/92 X |
| WO | WO 99/34488 | 7/1999 | ............... 385/88 X |
| WO | WO 01/50163 | 7/2001 | ............... 385/14 X |

* cited by examiner

*Primary Examiner*—Brian Healy
(74) *Attorney, Agent, or Firm*—Hamilton Brook Smith & Reynolds, P.C.

(57) ABSTRACT

A laser pump module has a ridge waveguide chip with a ridge width that is flared in the direction of the rear facet. Such a ridge profile yields a number of advantages depending on the specific implementation. The resulting increase in area of the rear facet, spreads heat, to improve device performance and avoid catastrophic optical mirror damage (COD). It can also lower the power density for the same output intensity. Further, it contributes to the single lateral mode property, acting as a mode filter. Higher order modes suffer higher losses and thus, tending to contribute to their attenuation—with less light fed back into the cavity from the rear facet, the laser device as a whole has reduced outside feedback sensitivity. Thus, in the implementation as a pump laser, less light at the signal wavelength returns to be amplified in a majority of the pump's ridge waveguide cavity. Still further, any back facet power monitor can be moved to improve its sensitivity level due to the large output and input area.

20 Claims, 10 Drawing Sheets

BACK FACET FLARED RIDGE FOR PUMP LASER

BACKGROUND OF THE INVENTION

Semiconductor laser devices such as ridge waveguide lasers and laser amplifiers are used in many communications systems. Incremental refinements in their fabrication and packaging have resulted in a class of devices that have acceptable performance characteristics and a well-understood long-term behavior. Moreover, weakly guiding ridge waveguide structures are less complex to fabricate and provide excellent yields as compared to more complex architectures based on buried heterostructures, for example.

In most applications, maximizing the laser's or amplifier's useful operating power is a primary design criteria. In signal laser applications, the power output from the device dictates the distance to the next repeater stage, and the number of stages in a given link is a major cost factor in the link's initial cost and subsequent maintenance. In pump laser applications, where typically multiple pump laser devices are used to optically pump a gain or amplifying fiber, such as a rare-earth doped fiber amplifier or regular fiber in a Raman pumping scheme, useful power output dictates the number of pumps required to reach a required pumping level and/or the distance between pump/fiber amplification stages.

Under current technology, the typical application for pump lasers is fiber amplification systems that utilize rare-earth doped fiber as the gain fiber. These gain fibers are located at attenuation-dictated distances along the fiber link. They typically are comprised of erbium-doped fiber amplifiers (EDFA). The laser pumps typically operate at 980 nanometers (nm) or 1480 nm, which correspond to the location of absorption peaks for the EDFA's in the optical spectrum.

More recently, Raman pumping schemes have been proposed. The advantage is that special, periodic, EDFA amplifier gain fiber is not required to be spliced into the fiber link. Instead, regular fiber can be used. The result is a gain spectrum that is even wider than systems relying on EDFA's. The bandwidth typically extends over the entire transmission bandwidth for fiber, stretching from 1250 to 1650 nm for some fiber compositions. The pump lasers are designed to operate in the wavelength range of 1060 to 1500 nm in the typical implementation.

Advantages associated with Raman amplification systems surrounds the fact that there is no longer a 3dB noise penalty associated with each amplifier, as occurs with EDFA's. Raman amplification, however, is a non-linear process. As a result, relatively high pump powers are required.

In any case, high power pumps are required, regardless of whether EDFA's or regular/Raman systems are used. Currently, pumps yielding 180 to 200 milliWatts (mW) of power are available. Newer system designs are requiring even higher power pumps, however.

SUMMARY OF THE INVENTION

As higher pump powers are required, additional optimizations are pursued in the pump laser module. One subject for these optimizations concerns the laser pump chip within the module. Specifically, in the present invention, the ridge profile of the laser chip is optimized both for high output power and also operation as a pump device, in which signal-band light, at other then the pump wavelength, is present.

Specifically, the present invention concerns a ridge waveguide laser module in which the ridge is flared in the direction of the rear or reflecting facet. Such a ridge profile yields a number of advantages depending on the specific implementation. The resulting increase in area of the rear facet spreads heat, to improve device performance and avoid catastrophic optical mirror damage (COD). It also lowers the power density for the same output intensity. Further, it contributes to the single lateral mode property, acting as a mode filter. Higher order modes suffer higher losses, which thus tends undermine the establishment of those modes. Further, with less light fed-back into the cavity from the rear facet, the laser device as a whole has reduced outside feedback sensitivity. Thus, in the implementation as a pump laser, less light at the signal wavelength returns to be amplified in a majority of the pump's ridge waveguide cavity. Still further, any back facet power monitor can be moved to improve its sensitivity level due to the large output and input area.

In general, according to one aspect, the present invention concerns a ridge waveguide pump laser module. The module is adapted to generate light in the 1.2 to 1.6 micrometer wavelength range. It comprises a ridge waveguide laser chip that has a back, reflective facet and a front facet. The pump light is emitted through this front facet. According to the invention, the ridge width increases in the direction of the rear facet.

In specific implementations, a medial to front section of the ridge has a width of 1.5 to 7 micrometers. The rearward section of the ridge has a widest width of 3–14 micrometers. Specifically, in a preferred embodiment, the rearward section of the ridge has a maximum width of 8–9 micrometers and a medial to front section of the ridge has a width of 5 to 6 micrometers.

According to other specifics of the embodiments, the end of the optical fiber pigtail, which is positioned to receive light generated by the ridge waveguide laser chip, preferably comprises a flat-top wedge shaped fiber lens. The core of the fiber may also be flared in the direction of the chip and/or elliptical. Polarization maintaining fiber pigtails, such as polarization controlling fiber pigtails, are preferred especially if a grating is included for power stabilization.

In the anticipated implementation, the module is used to pump an EDFA amplifier. Alternatively, non-rare-earth doped gain fiber is used as the gain fiber in a Raman amplification scheme, however.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

Figure 1:
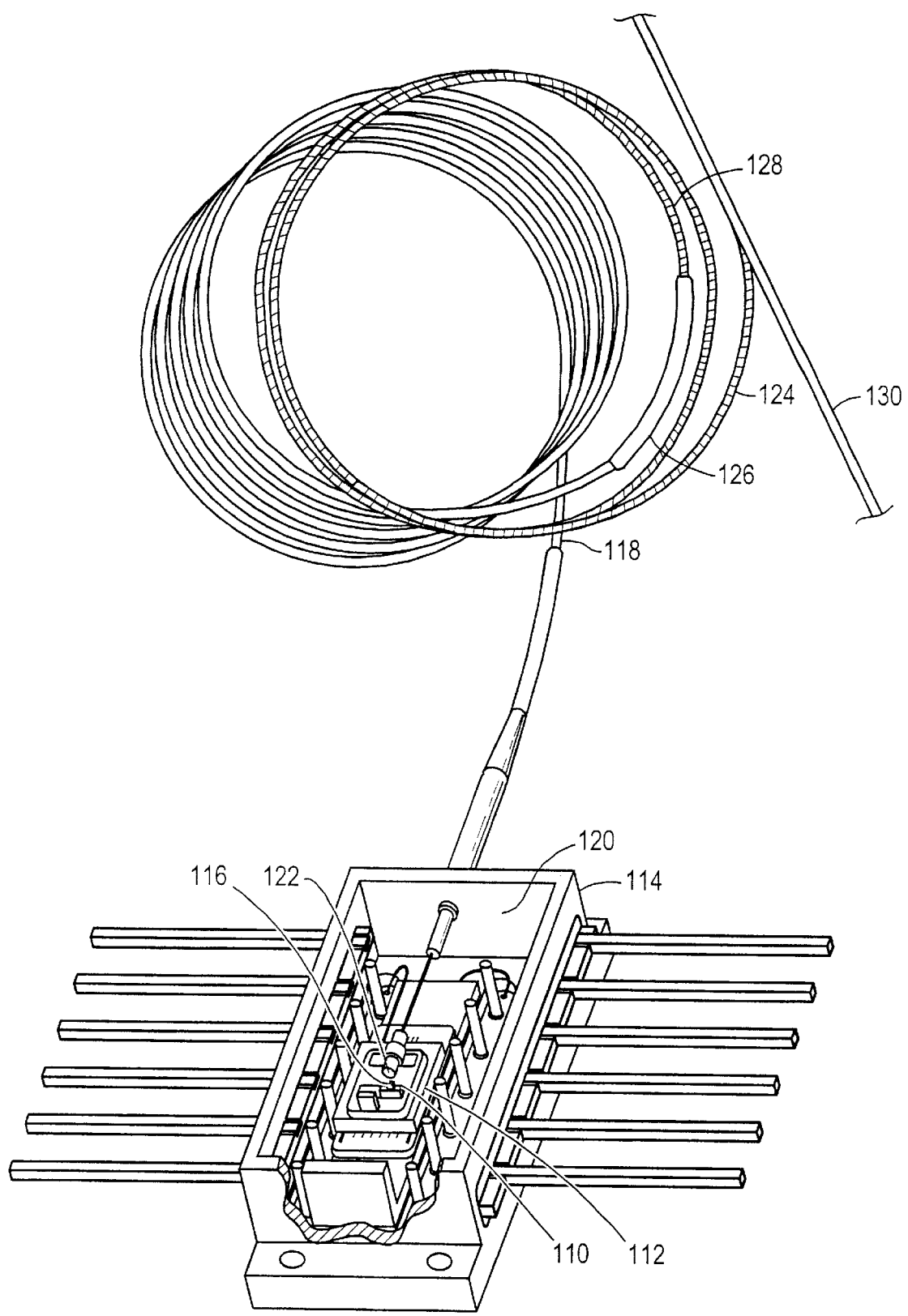
FIG. 1 is a perspective view of a pump laser module according to the present invention.

FIG. 1 shows a pump laser module, which has been constructed according to the principles of the present invention and which contains a ridge waveguide laser chip according to the present invention.

Specifically, the ridge waveguide laser chip 110 is installed on a submount 112 in the typical implementation. The submount 112 provides mechanical and electrical connections between the laser chip 110 and the module housing 114. A fiber pigtail 118 extends through a side wall 120 of the module housing 114. It is typically rigidly secured to the submount 112 such that the fiber endface 122 is held in proximity to an output facet 116 of the laser diode 110.

Depending on the implementation and application requirements, fiber pigtail 118 is constructed from regular or, alternatively, polarization-maintaining fiber. If used, different types of polarization-maintaining fiber are applicable. For example, panda, elliptical stress bar, and bow tie are viable substitutes as are polarization controlling fiber.

In one implementation, a grating 128 is written into the regular fiber 124 to create an external cavity to stabilize the operation of the chip 110. These gratings are typically manufactured by UV beam interference. The gratings are usually written to the depth of the core in the fiber. In pump applications, they have the effect of stabilizing the module against temporal power output fluctuations.

In the preferred implementation, the fiber grating provides reflectivity at about 1450 nm, which is within the gain band of the diode laser 110. Further, the fiber grating has a bandwidth of 0.5–5 nm, preferably, although a range as large as 0.2–7 nm is required for some implementations.

The polarization control maximizes and stabilizes the effect of the fiber grating. Light exiting from the typical diode laser is polarized. As a result, any light that is coupled into another, non-favored fiber axis, i.e., the axis of the fiber that is not aligned with the polarization of the laser diode if such axis exists, is reflected by the grating, but has no effect on the laser diode since the diode is nonresponsive to light of this polarization.

If fiber pigtail 118 comprises PM fiber, it is preferably is optically coupled to a strand of regular fiber 124 via splice 126. Regular fiber preferably has a standard circular cross section core, i.e., has no stress bar, or no fast or slow axes.

Although the coupling between the polarization-maintaining fiber pigtail 118 and regular, non-polarization-maintaining fiber 24 is shown as a direct fusion splice. The critical feature is the optical coupling between the two fibers. Thus, other techniques for obtaining this coupling can be used such as intervening fiber lengths of a third fiber.

In a similar vein, the PM fiber need not directly receive the light from the diode. Instead, the light can be first coupled into a relatively short length of regular fiber for example, and then into PM fiber, which transmits the light over most of the distance to the grating. This is not preferred, however, because of the need for additional splicing.

In any event, light coupled into the pigtail 118 is transmitted toward the fiber amplification system. This system comprises an EDFA, in which the fiber is erbium-doped. Alternatively, as discussed previously, Raman amplification principles can be used. In this case, the fiber amplification system 130 comprises regular fiber, or fiber which is optimized for Raman amplification, and has the associated wide gain spectrum.

This module further comprises a thermo-electric cooler to provide for heat dissipation. However, for undersea applications, a coolerless module is typically acceptable.

Figure 2:
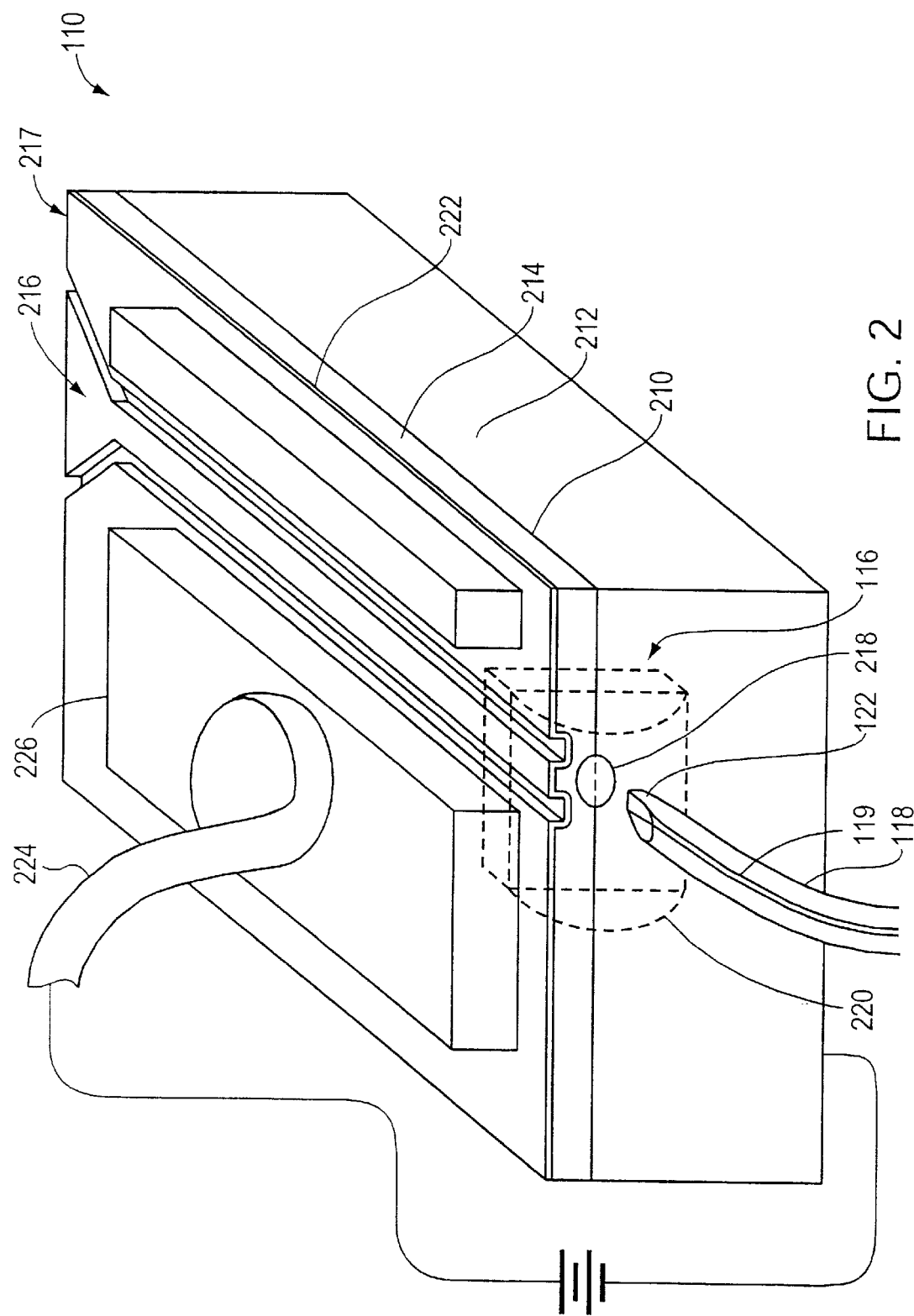
FIG. 2 is a schematic, perspective view of the inventive laser chip and coupling techniques for the light generated by the chip into the fiber pigtail.

FIG. 2 is a schematic view showing the laser chip 110 and techniques for coupling the light generated by the chip into the fiber pigtail 118.

Specifically, light is generated in the active layer 210 by recombination and confined by a lower cladding layer 212 and an upper cladding layer 214. It is guided longitudinally by the ridge structure 216, which has been etched into the top cladding layer 214. As a result, the light is confined to oscillate between a partially or antireflecting front facet 116 and a highly reflecting rear facet 217. Most of the generated light exits from the laser chip 110 at a emission region 218, which generally is elliptically shaped.

Cladding layers of AlGaInAs or InGaAsP on an InP substrate are compatible with the 1060-, 1200–1600 nm light generation. Quantum wells of InGaAsP, AlGaInAs, or InGaAs are used, typically.

The emitted light forms a cone with an elliptical cross-section. The end of the fiber pigtail 11 8 is located such that coupling efficiency is maximized. Most of the emitted light is captured to be transmitted by the fiber pigtail 118.

One approach for maximizing coupling efficiency is to form a lens on the end of the fiber pigtail 118. Various fiber lens systems can be used, such as wedge-shaped fiber lenses, double-wedge-shaped fiber lenses, elliptical-cone-shaped fiber lenses, and lens systems including elliptically-shaped lenses or cylindrical lenses, generally.

Presently, double-angle flat top microlenses are used as described in the application entitled "Flat Top, Double-Angled, Wedge-Shaped Fiber Endface", U.S. Ser. No. 08/965,798, by Jeffrey Korn, Steven D. Conover, Wayne F. Sharfin and Thomas C. Yang, which is incorporated herein by this reference.

The advantage of double-angle flat top microlenses is the fact that they are not circularly symmetric with respect to the fiber's axis, to thereby match the elliptical spatial distribution of light from the output facet of the laser diode.

When non-circularly symmetric coupling techniques are used with polarization-maintaining fiber, it is important to align the formed microlense, for example, with one of either the fast or slow axes of the polarization-maintaining fiber, if two transmission axes are present.

Alternatively, a discrete lens or discrete lense system can also be used as illustrated in FIG. 2. Specifically, a cylindrical lens 220 is located between the end of the fiber pigtail and the emission region 218 of the laser chip 110. Such a lens are typically used in combination with a simple cleaved-end surface of the fiber pigtail 118. Additionally, a fiber lens is used in combination with discrete lens 122 in some embodiments, as illustrated.

Preferably, because of the elliptical emission of this wide ridge laser, a cylindrical lens as illustrated is preferably used. Alternatively, a cross-cylindrical discrete lens can also be implemented.

Alternately, the core 119 of the pigtail 118 has an elliptical cross-section at least at an end which is positioned to receive light generated by the laser chip 110. This configuration provides good matching to the elliptical emission 218 from the chip. Additionally, a width of the core is tapered in a direction of light propagation away from the laser chip, i.e., flared in the direction of the chip, to maximize coupling efficiency, in some embodiments.

A P-metal contact layer 122 is typically located above the upper cladding layer 114 but separated by at least one insulation layer, not shown. This insulation layer is typically not present, however, between the P-metal layer 222 and the upper cladding layer 214 in the region of the ridge 216. This allows a ridge injection current to be transmitted down through the ridge 216 into the active layer 210. The ridge injection current is usually provided to the chip via a wire 224, which is bonded to a bond pad 226 that is usually comprised of gold or gold alloy. The P-metal contact layer 222 is typically a gold alloy.

Figure 3:
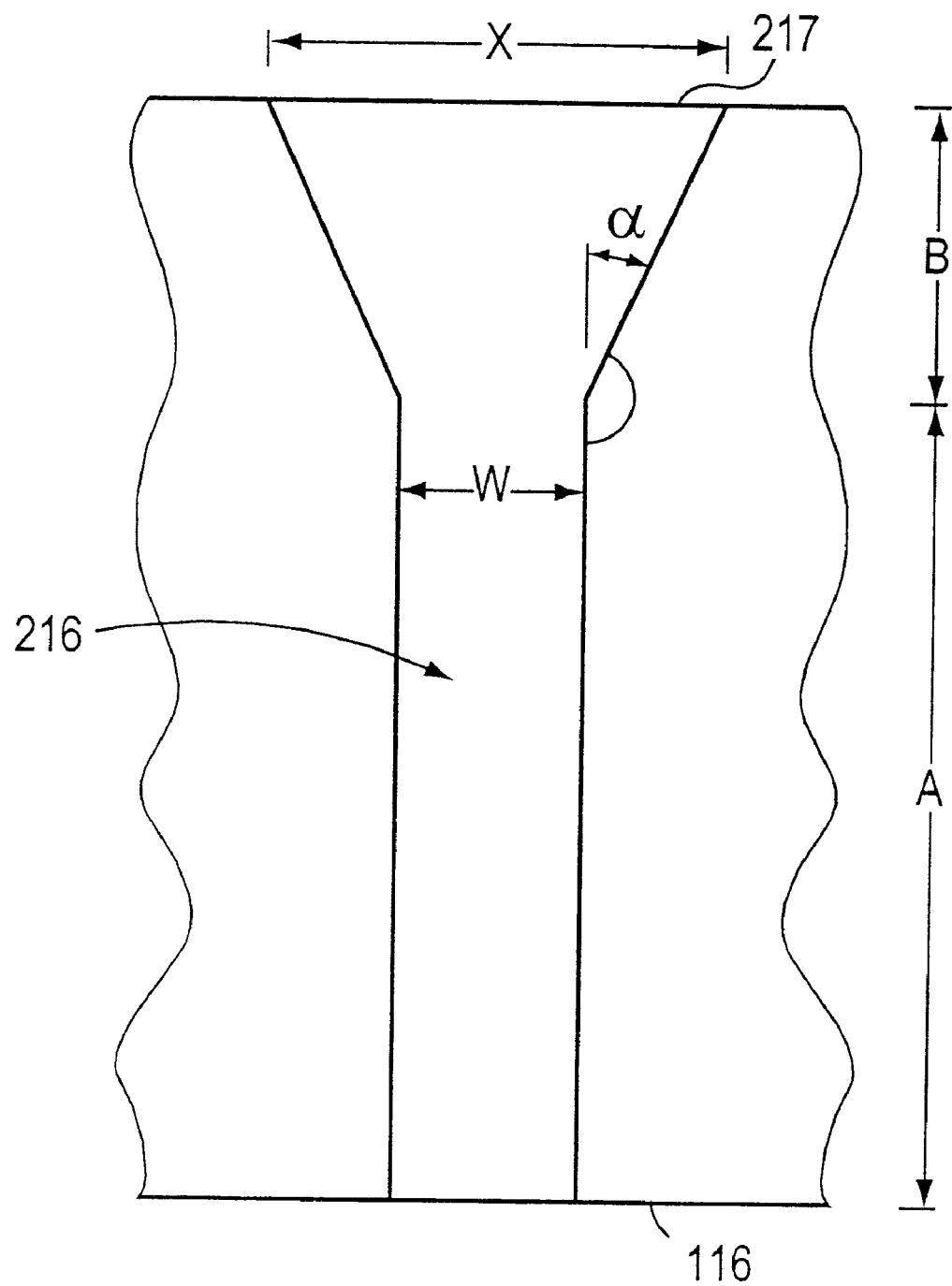
FIG. 3 is a top-plan view showing the ridge profile of the present invention.

FIG. 3 is a top plan view showing the ridge profile according to the present invention. Generally, a medial to front portion of the ridge (A) has a width W. This width is preferably 1.5 to 7 micrometers. Currently, 5–6 micrometers are believed to be optimum.

A rearward section of the ridge (B) is flared in the direction of the rear facet 217. Preferably, the widest section of the rearward section (X) has a width of 3–14 micrometers. Preferably, the width is 8–9 micrometers according to a present preferred embodiment, especially, when the front ridge width is 5 to 6 micrometers.

The overall length of the device (A+B) is usually between 500 and 2500 $\mu$m, with about 1200 $\mu$m being preferred. The length of the rearward section is 10 to 200 $\mu$m preferably As a result, the angle $\alpha$ is greater than 0 degrees in the present invention. In some implementations, it can be as great as 30°, however. In the typical implementation, the angle $\alpha$ is between 0.01° and 8°.

FIGS. 4A–4D illustrate the process by which the inventive flared-ridge pump laser chip is manufactured.

Figure 4A:
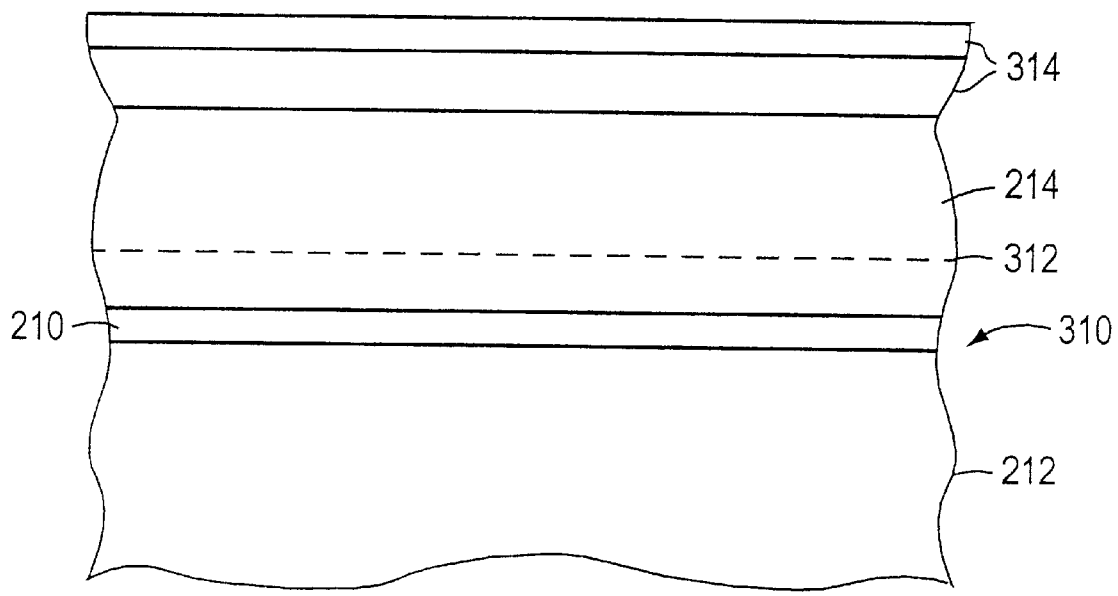
FIGS. 4A–4D are cross-sectional views illustrating the process by which the inventive wide-ridge pump laser chip is manufactured.

Specifically, as illustrated in FIG. 4A, the process starts with a semiconductor wafer substrate 310. This substrate has the epitaxially-grown lower cladding layer 212, active layer 210, and upper cladding layer 214.

An etchstop layer 312 is preferably provided in the upper cladding layer to control the etch depth of the subsequent ridge etch steps. In the preferred embodiment, the distance between the active layer 210 and the etchstop layer 312 is relatively large, between 0.3 and 0.9 micrometers, possibly to as large as 1.1 micrometers in some embodiments. This distance is consistent with the relatively wide ridge approach. Specifically, it yields a more weakly-guided chip, which guarantees single lateral mode operation to very high output power and also minimizes the power loss by the lowest order mode. Specifically, in the preferred embodiment, the distance between the active layer 210 and the etchstop layer 312 is between 0.5 and 0.7 $\mu$m.

On top of the upper cladding layer, insulation layers 314 are grown. These provide the electrical insulation between the upper cladding layer 214 and the subsequent P-metal contact layers.

Figure 4B:
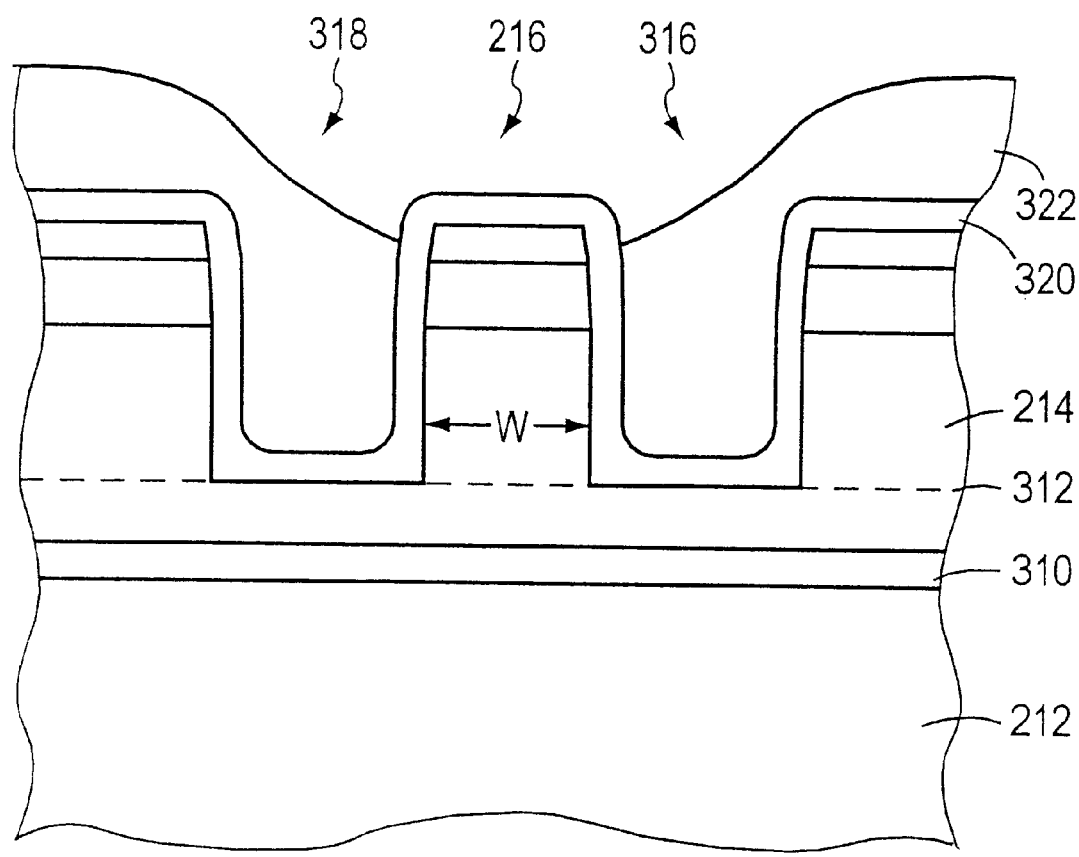

FIG. 4B shows the next step in which trenches 316, 318 are etched into the upper cladding layer 214, to the depth of the etchstop layer 312 to thereby define the ridge 216. Subsequently, an additional insulation layer 320 is formed over the substrate.

Next, photoresist layers 322 are deposited over the substrate using hard and soft bake techniques. The photoresist layer is then partially etched back to expose the top of the ridge 216.

Figure 4C:
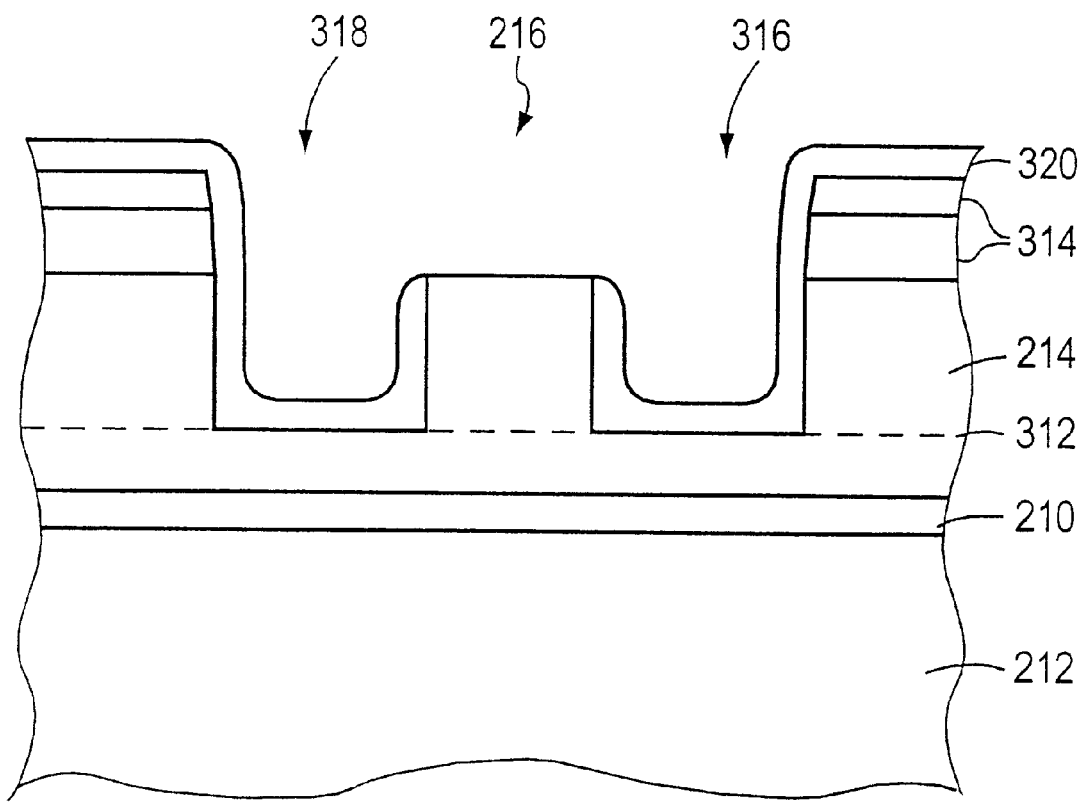

FIG. 4C shows the next step in which the insulation layers are etched away from the top of the ridge 216. This leaves the upper cladding layer exposed only in the region of the ridge.

Figure 4D:
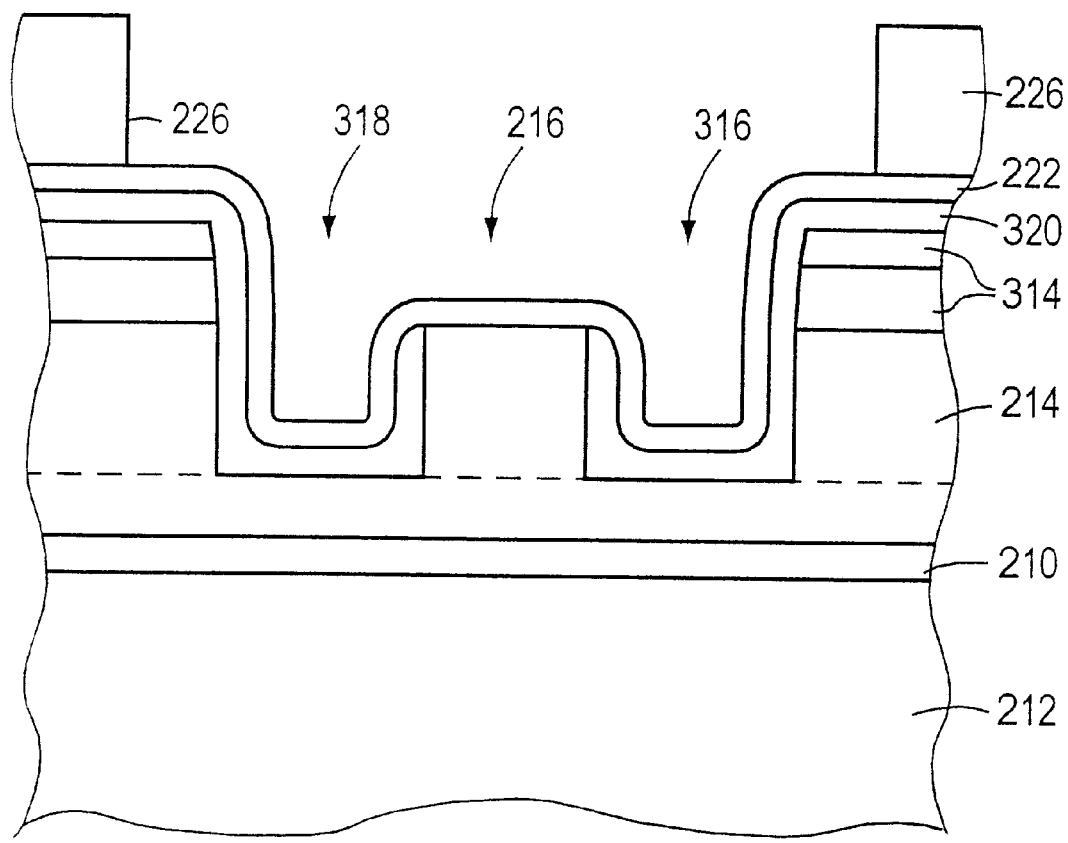

As shown in FIG. 4D, the P-metal contact layer 222 is deposited. Typically, this contact layer is made from a gold alloy. Thereafter, the gold bond pads 226 are formed.

Figure 5A:
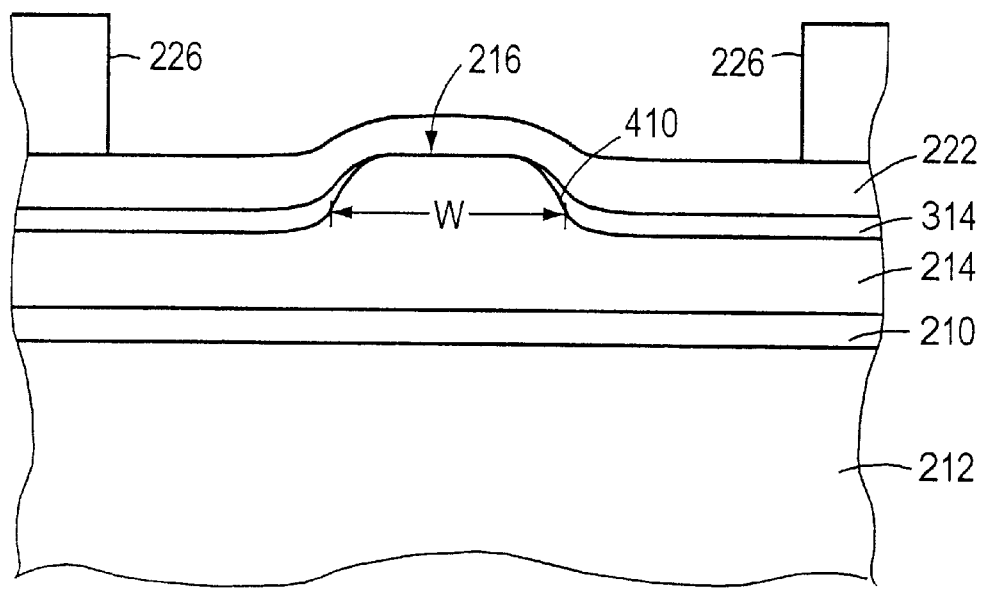
FIGS. 5A and 5B are a cross-sectional views showing alternative ridge designs.
Figure 5B:
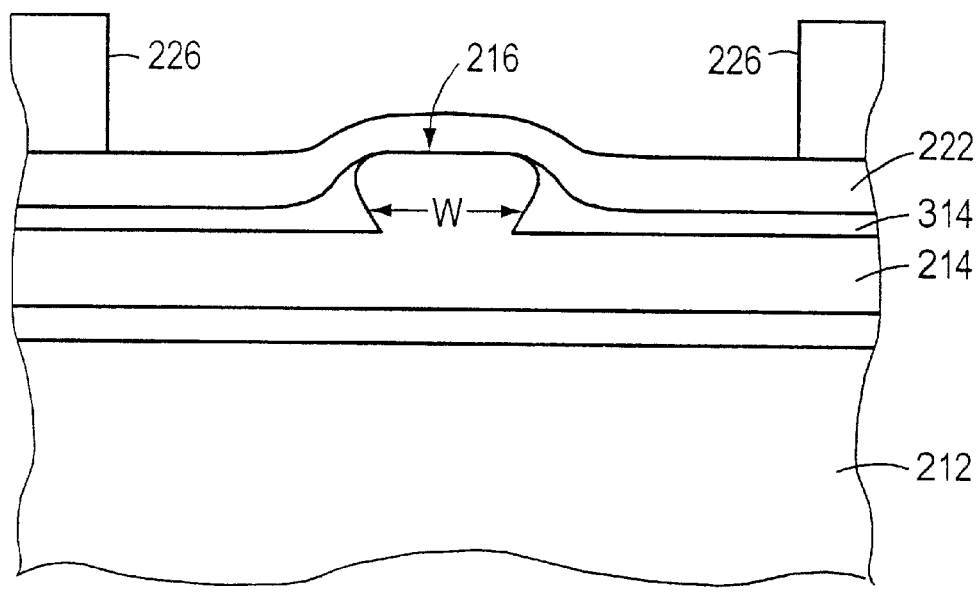

FIGS. 5A and 5B show an alternative ridge designs, to which the present invention is also applicable, in which similar reference numerals being used to illustrate similarities in construction. Here, the ridge is not defined by trenches as illustrated in FIGS. 4A–4D, but the surrounding upper cladding layer is completely etched away.

Specifically, a lower cladding layer 212 and an upper cladding layer 214 sandwich an active layer 210. On top of the upper cladding layer is an insulation layer 314, which isolates the upper cladding layer 214 from the P-metal contact layer 222. The contact layer, however, is in electrical contact with the upper cladding layer 314 in the region of the ridge 216. On one or both sides of the ridge 216, bond pads 226 are formed, which also provide for ridge protection.

In the alternative embodiment illustrated in FIG. 5A, the ridge width is as defined earlier, i.e., is 1–7$\mu$m, preferably 5–6 $\mu$m. Width is defined slightly differently, since the sides of the ridge are sloped, rather than vertical as shown in FIGS. 4A–4D. Here, the ridge width is defined as the width of the ridge, three-quarters of the way down the sloping side wall 410 of the upper cladding layer 214.

In the reverse ridge embodiment illustrated in FIG. 5B, the ridge width is also as defined earlier, i.e., is 1–7 $\mu$m, preferably 5–6 $\mu$m. Width here is the width at the base of the ridge, w.

In still other implementation, the ridge is buried/planarized by depositing photoresist, polyimide, semiconductor material, or other material on either side of the ridge.

As is known in the art, many tens of ridges are typically formed side-by-side and parallel to each other along a single substrate/wafer. After the fabrication steps have been completed, the wafer is typically scribed and cleaved along the planes that run perpendicular to the ridges along the length of the wafer. This yields what are termed bars. Typically, the facet coatings for the reflective rear facet 216 and partially or antireflecting front facet 116 are then applied to these bars. Thereafter, the bars are scribed and cleaved between successive ridges to form individual semiconductor laser devices as shown in FIG. 2.

Modification to the profiles are possible, and contemplated by the present invention. Specifically, FIGS. 6A–6B illustrate two changes to the overall ridge profile.

Figure 6A:
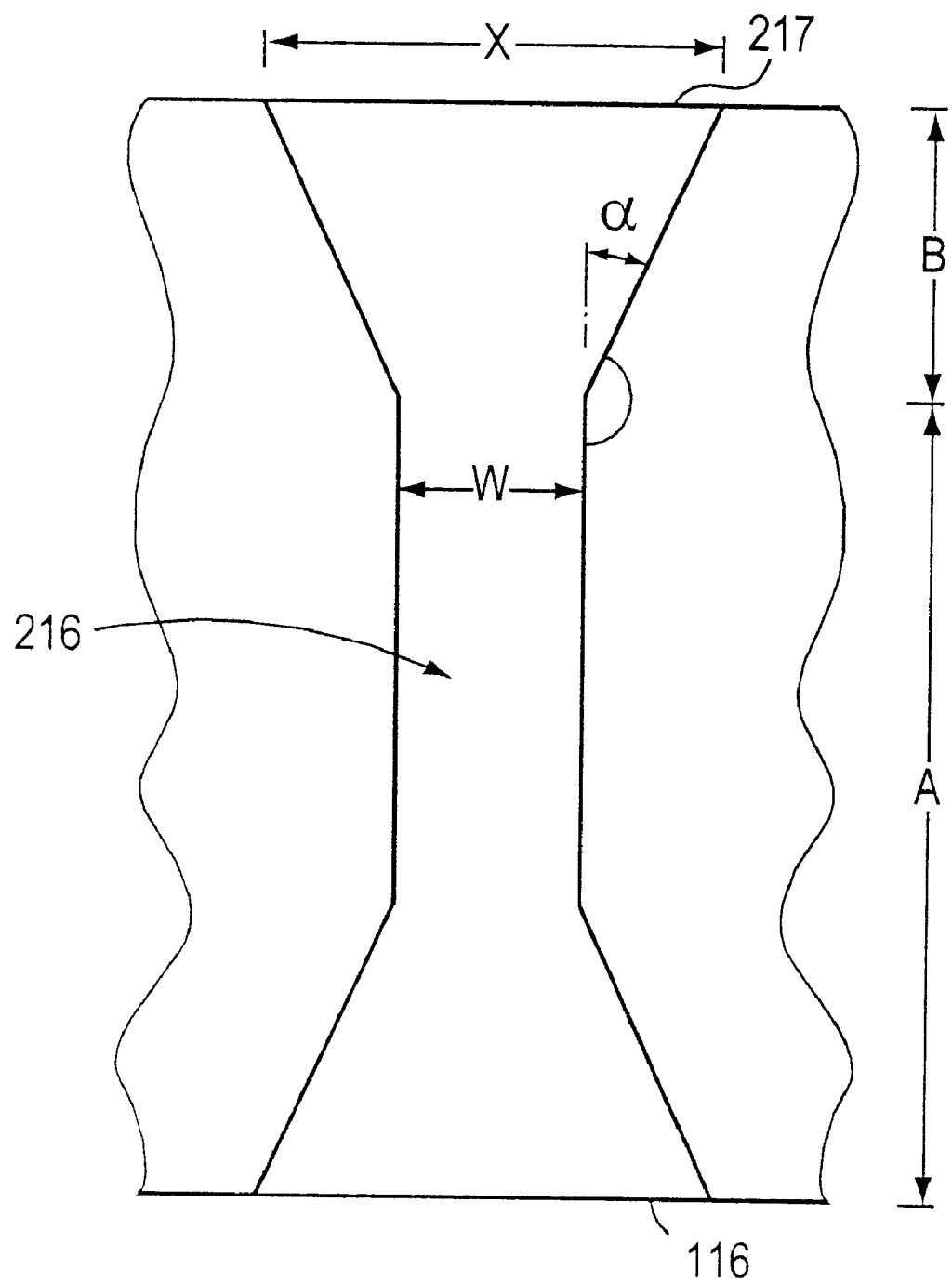
FIGS. 6A–6B are top plan views illustrating different ridge profiles for the present invention.
Figure 6B:
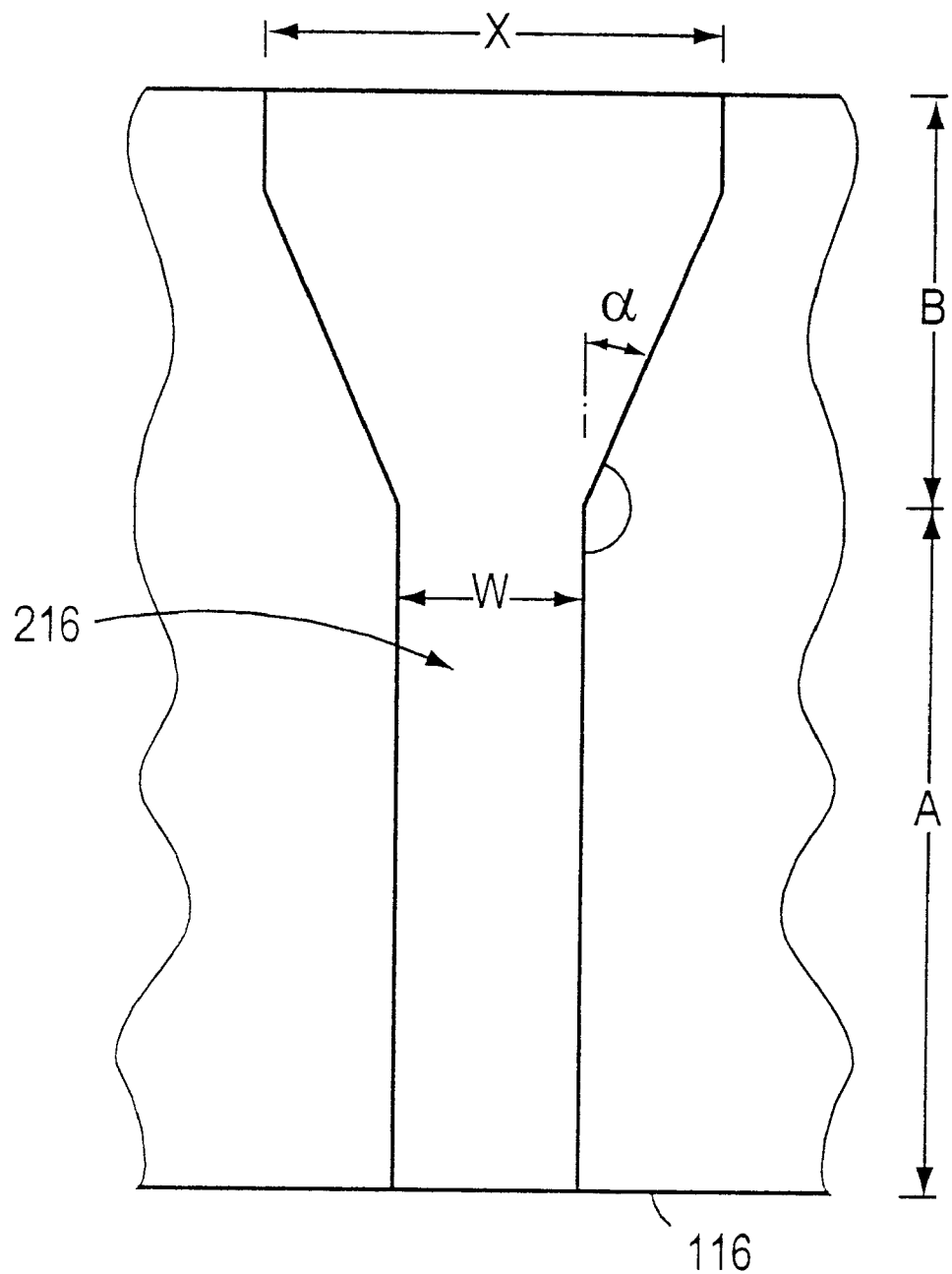

Specifically, as shown in FIG. 6A, in one embodiment, the ridge 216 is also flared in the direction of the front facet 116 to further avoid catastrophic facet damage at that facet also.

FIG. 5B shows another ridge profile in which the ridge 216 is flared in the direction of the rear facet 217, but then the flared terminated just before the rear facet and the width is held constant.

While this invention has been particularly shown and described with references to preferred embodiments thereof, it will be understood by those skilled in the art that various changes in form and details may be made therein without departing from the scope of the invention encompassed by the appended claims.

What is claimed is:

1. A ridge waveguide pump laser module that is adapted to generate light in the 1.2–1.6 $\mu$m wavelength range, the module comprising:

a ridge waveguide laser chip comprising a back, reflective facet and front facet through which the laser chip emits light, wherein a ridge width increases in a direction of the back facet; and a optical fiber pigtail, an end of which is positioned to receive and transmit light emitted from the front facet by the laser chip.

2. A ridge waveguide pump laser module as claimed in claim 1, wherein a medial to front section ridge width is 1.5 to 7 μm.

3. A ridge waveguide pump laser module as claimed in claim 2, wherein a rearward section ridge width is 3–13 μm.

4. A ridge waveguide pump laser module as claimed in claim 2, wherein a rearward section ridge width is 8–9 μm.

5. A ridge waveguide pump laser module as claimed in claim 1, wherein medial to front section ridge width is 5 to 6 μm.

6. A ridge waveguide pump laser module as claimed in claim 5, wherein a rearward section ridge width is 3–13 μm.

7. A ridge waveguide pump laser module as claimed in claim 5, wherein a rearward section ridge width is 8–9 μm.

8. A ridge waveguide pump laser module as claimed in claim 1, wherein a rearward section ridge width is 3–13 μm.

9. A ridge waveguide pump laser module as claimed in claim 1, wherein a rearward section ridge width is 8–9 μm.

10. A ridge waveguide pump laser module as claimed in claim 1, wherein the end of the optical fiber pigtail, which is positioned to receive light generated by the ridge waveguide laser chip, comprises a flat-top wedge shaped fiber lens.

11. A ridge waveguide pump laser module as claimed in claim 1, wherein a core of the optical fiber pigtail is elliptical at least at an end that is positioned to receive light generated by the laser chip.

12. A ridge waveguide pump laser module as claimed in claim 11 wherein a width of the core is tapered in a direction of light propagation away from the laser chip.

13. A ridge waveguide pump laser module as claimed in claim 1, wherein a distance between an active layer and a base of the ridge of the laser chip is 0.3–0.9 μm.

14. A ridge waveguide pump laser module as claimed in claim 1, wherein a distance between an active layer and a base of the ridge of the laser chip is 0.6–0.7 μm.

15. A ridge waveguide pump laser module as claimed in claim 1, wherein the module is used to pump an EDFA amplifier.

16. A ridge waveguide pump laser module as claimed in claim 1, wherein the module is used to pump a Raman amplifier.

17. A ridge waveguide pump laser module as claimed in claim 1, wherein the module is used to pump a dispersion compensated fiber.

18. A ridge waveguide pump laser module as claimed in claim 1, wherein the laser chip is composed of InGaAsP.

19. A ridge waveguide pump laser module as claimed in claim 1, wherein the laser chip is composed of InGaAlAs or InGaAlAs and InGaAsP.

20. A ridge waveguide pump laser module as claimed in claim 1, wherein the optical fiber is a polarization maintaining (PM) fiber.

* * * * *